United States Patent [19]

Ishikawa et al.

[11] Patent Number: 5,394,014

[45] Date of Patent: Feb. 28, 1995

[54] SEMICONDUCTOR DEVICE IMPROVED IN LIGHT SHIELDING PROPERTY AND LIGHT SHIELDING PACKAGE

[75] Inventors: Masahiko Ishikawa; Kohji Hayano; Shinichi Mori; Masayuki Yamashita; Osamu Ueda; Namiki Moriga, all of Hyogo, Japan

[73] Assignee: Mitsubishi Denki Kabushiki Kaisha, Tokyo, Japan

[21] Appl. No.: 149,893

[22] Filed: Nov. 10, 1993

Related U.S. Application Data

[63] Continuation of Ser. No. 792,872, Nov. 19, 1991, Pat. No. 5,317,195.

[30] Foreign Application Priority Data

Nov. 28, 1990 [JP] Japan .................. 2-127935
Nov. 28, 1990 [JP] Japan .................. 3-335398
Oct. 31, 1991 [JP] Japan .................. 3-286350

[51] Int. Cl.⁶ .................................................. H01L 23/28
[52] U.S. Cl. ............................... 257/790; 257/435; 257/792; 257/795
[58] Field of Search ............. 257/790, 792, 787, 795, 257/433, 435

[56] References Cited

U.S. PATENT DOCUMENTS

| | | | |
|---|---|---|---|
| 4,633,573 | 1/1987 | Scherer | 29/589 |
| 4,674,175 | 6/1987 | Stampfli | 257/708 |
| 4,680,617 | 7/1987 | Ross | 257/795 |
| 4,712,129 | 12/1987 | Orcutt | 257/739 |
| 4,758,875 | 7/1988 | Fuyisaki et al. | 257/790 |
| 4,785,338 | 11/1988 | Kinoshita et al. | 257/435 |
| 4,803,543 | 2/1989 | Inayoshi et al. | 257/783 |
| 4,953,002 | 8/1990 | Nelson et al. | 257/659 |
| 5,031,017 | 7/1991 | Pernyeszi et al. | 257/790 |
| 5,043,534 | 8/1991 | Mahulikar et al. | 257/708 |

FOREIGN PATENT DOCUMENTS

0421343 2/1990 European Pat. Off. .

(List continued on next page.)

OTHER PUBLICATIONS

"A Scientific Guide To Surface Mount Technology", *Electrochemical Publications Limited*, 1988; pp. 10–13, by C. Lea.

M. T. Goosey, "Plastics for Electronics"m Ed. Elsevier Applied Science Publishers London (1985).

H. J. Hacke, "Montage Integrierter Schaltungen", Springer Verlag Berlin (1987), pp. 131–135 Elektrotechnik, No. 3 of Feb. 29, 1988, pp. 24–26.

*Primary Examiner*—Robert P. Limanek
*Assistant Examiner*—Roy Potter
*Attorney, Agent, or Firm*—Lowe, Price, Leblanc & Becker

[57] ABSTRACT

In accordance with one aspect of the present invention, provided is a semiconductor device comprising a semiconductor chip which is directly covered with a resin material having a light shielding property as well as a film which is provided on the resin material for shielding the semiconductor device against light. The film may be formed by a seal having a surface which is covered with a metal and a rear surface which is colored black, a layer of a metal or ceramics which is deposited in a vapor phase, or a coating of an insulating material whose refractive index is different from that of the resin material. In another aspect of the present invention, provided is a semiconductor device which is directly covered with a resin material mixed with a light absorbing material. In still another aspect of the present invention, provided is a semiconductor device comprising a semiconductor chip, having a surface covered with black polyimide, which is further covered with a resin material having a light shielding property. In a further aspect of the present invention, provided is a package for covering a semiconductor device which is mounted on a wiring board. According to such improvement, a light shielding property is improved particularly in relation to a thin semiconductor device whose thickness is only about 1 mm, and the semiconductor device is prevented from a malfunction caused by light.

8 Claims, 4 Drawing Sheets

FOREIGN PATENT DOCUMENTS

| | | |
|---|---|---|
| 254949 | 6/1967 | Germany . |
| 1614587 | 8/1967 | Germany . |
| 2100103 | 7/1971 | Germany . |
| 2931594 | 8/1979 | Germany . |
| 3120279 | 8/1981 | Germany . |
| 3433779 | 9/1984 | Germany . |
| 3442131 | 11/1984 | Germany . |
| 3742763 | 12/1987 | Germany . |
| 59-72748 | 4/1984 | Japan . |
| 60-180150A | 1/1988 | Japan . |
| 2-49453 | 2/1990 | Japan . |
| 2280364 | 4/1990 | Japan . |
| 2119167 | 5/1990 | Japan . |
| 2-335398 | 11/1990 | Japan . |
| 2-127935 | 11/1991 | Japan . |

… 1

SEMICONDUCTOR DEVICE IMPROVED IN LIGHT SHIELDING PROPERTY AND LIGHT SHIELDING PACKAGE

This application is a continuation of application Ser. No. 07/792,872, filed Nov. 19, 1991, now U.S. Pat. No. 5,371,195.

BACKGROUND OF THE INVENTION

1. Field of the Invention

The present invention relates to a semiconductor device and a package for a semiconductor device, and more particularly, it relates to an improvement of a semiconductor device for protecting a semiconductor chip against light.

2. Description of the Background Art

In recent years, a semiconductor chip is generally directly housed with a molded resin material, to be applied to a semiconductor device. The semiconductor chip is mainly covered with an epoxy resin material, which is mixed with a coloring agent such as carbon black, a filler and the like at need. In a conventional semiconductor device, such a resin material protects the semiconductor chip against light.

In relation to semiconductor devices having photodetectors, there have been reported various light shielding means, which are adapted to prevent portions other than such photodetectors from irradiation of light. For example, Japanese Patent Laying-Open No. 62-205649 (1987) discloses a semiconductor device comprising a photodetector and an IC connected thereto, which are sealed with a light transmitting resin material. The resin material is covered with a light shielding coating material, except for a window for applying light to the photodetector. Japanese Patent Laying-Open No. 1-147853 (1989) discloses a photodetector module comprising an IC having a photodetector such as a photodiode and an amplifier circuit provided on the same substrate and a photoresist material covering the same, which are housed in a clear mold package. In such a module, a frame covers the IC so that no light is applied to portions other than the photodetector, while the same is provided with a window for applying light to the photodetector. Japanese Patent Laying-Open No. 1-152664 (1989) discloses a semiconductor device comprising an integrated circuit pellet containing a photodetector which is housed in a light transmitting resin package. In such a semiconductor device, a plate having a through hole in a position corresponding to the photodetector is brought into close contact with the surface of the resin package. This plate is prepared from aluminum, for example, to intercept light. Thus, it is possible to apply light only to the photodetector through this plate.

With recent prevalence of note-type personal computers and electronic notebooks, ICs are increasingly reduced in size and thickness. Further, packages for dynamic RAMs, One Time Programmable ROMs and the like are also increasingly reduced in thickness and weight. Consequently, TSOPs (thin small outline packages), which are only about 1 mm in thickness, are put into practice in succession.

However, while a conventional resin package for a semiconductor device has a sufficient thickness for intercepting light, the thickness of a resin material forming a TSOP is so small that light may reach a semiconductor chip. If light passes through the resin material to reach the semiconductor chip, the storage contents of a memory may be erroneously erased in the case of the One Time Programmable ROM, while a malfunction may be caused by leakage of a cell charge or a leakage current in a circuit part in the case of a dynamic RAM. The degree of such a malfunction may depend on intensity of the light and the thickness of the resin material.

The aforementioned techniques regarding photodetectors can be applied in order to solve such a problem. However, none of such techniques can guarantee a sufficient light shielding property while maintaining the package in the reduced thickness and weight.

SUMMARY OF THE INVENTION

An object of the present invention is to provide a semiconductor device having a resin package which is reduced in thickness and weight, with sufficient guarantee for a light shielding property.

Another object of the present invention is to provide a package for a semiconductor device, which can sufficiently guarantee a light shielding property for a TSOP.

According to one aspect of the present invention, provided is a semiconductor device comprising a semiconductor chip which is directly covered with a resin material having a light shielding property, and this semiconductor device further comprises a light shielding film provided on the, resin material. The resin material can be prepared from epoxy resin, for example. A coloring agent such as carbon black, a filler, and the like may be added to the resin material at need.

The aforementioned film can be formed by a seal having a surface which is covered with a metal and a rear surface which is colored black. The metal may be prepared from aluminum or silver, for example. This seal is preferably bonded onto the surface of the resin material sealing the semiconductor chip, to sufficiently effectively cover the semiconductor chip. The seal may substantially cover the overall surface of the resin material, or partially cover the same. When the thickness of the resin material deposited on the semiconductor chip is not more than 200 μm or that of the semiconductor device itself is not more than 1 mm, this seal has a remarkable effect particularly in relation to a light shielding function. The seal reflects light on its surface, while the same absorbs light on its rear surface. Due to such a double mechanism, it is possible to sufficiently intercept light with a small thickness. Since the seal is not bulky, the weight of the semiconductor device is not much increased.

The aforementioned film can be formed by a metal layer or a ceramic layer, which is deposited in a vapor phase. In this case, it is preferable that the thickness of the resin material deposited on the semiconductor chip is not more than 200 μm, or that of the semiconductor device itself is not more than 1 mm. The metal layer can be prepared from aluminum or silver, for example. On the other hand, the ceramic layer can be essentially prepared from alumina or $SiO_2$, for example. The metal or ceramic layer may be formed over the entire surface of the resin material, or a portion, where the same can sufficiently cover the semiconductor chip, on the surface of the resin material. Such a metal or ceramic layer deposited in a vapor phase sufficiently effectively intercepts light, although the same is extremely thin. This layer effectively maintains the reduced size of the semiconductor device, and will not much increase the weight thereof.

Further, the aforementioned film can be prepared from an insulating material which is different in refractive index from the resin material. For example, such an insulating material is prepared from the same material as the resin material, which has a surface portion being promoted to gelate as compared with other portions, or which is different in distribution of molecular weight or degree of polymerization from the resin material, or a material which is different from the resin material and mainly composed of tetrahydrofuran or thermosetting resin. In the case of the same material, such a film can be formed by partially heating the surface of the resin material for causing gelation. In the case of a different material, on the other hand, the film can be formed by a method of dipping a resin mold in a melted insulating material and thereafter extracting the same for a drying or photo-hardening process, a method of applying an insulating material to a resin mold, or the like. The insulating material may cover the overall surface of the resin material, or partially cover the same. Further, a single layer of an insulating material, or at least two layers of different insulating materials may be provided on a resin mold. The insulating material and the resin mold are adapted to refract external light to prevent penetration of the light. Further, it is possible to reduce transmittance of such light by overlapping materials having different refractive indices. In addition, the insulating material may contain a material for absorbing light. Such a material is prepared from an oxide, a sulfide or a salt of a metal, an inorganic pigment such as a ferrocyanic compound, or an organic pigment such as an azo-based one or a phthalocyanine-based one, for example.

In accordance with another aspect of the present invention, provided is a semiconductor device comprising a semiconductor chip which is directly covered with a resin material having a light shielding property, and this resin material is mixed with a material for absorbing light. The material for absorbing light is prepared from an oxide, a sulfide or a salt of a metal, an inorganic pigment such as a ferrocyanic compound, or an organic pigment such as an azo-based one or a phthalocyanine-based one, four example. When the thickness of the resin material deposited on the semiconductor chip is not more than 200 μm or that of the semiconductor device itself is not more than 1 mm, such a light absorbing material particularly serves a remarkable function in relation to a light shielding property. The light shielding property of a resin mold is further improved by addition of such a light absorbing material.

According to still another aspect of the present invention, provided is a semiconductor device comprising a semiconductor chip which is covered with a resin material having a light shielding property, and the surface of the semiconductor chip is covered with a polyimide film which is mixed with a black substance. Such a black substance is prepared from carbon or the like, for example. The black polyimide film protects the semiconductor chip against light.

According to a further aspect of the present invention, provided is a package for covering a semiconductor device, comprising a semiconductor chip which is covered witch a resin material, for shielding the same against light. This package is adapted to cover one or at least two semiconductor devices which are mounted on a wiring board. This package is particularly effective when the thickness of the resin material deposited on the semiconductor chip is not more than 200 μm or that of the semiconductor device itself is not more than 1 mm. The package can be made of resin, ceramics or a metal, for example. This package covers one or at least two semiconductor devices which are mounted on a wiring board, to protect the semiconductor device(s) against light.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
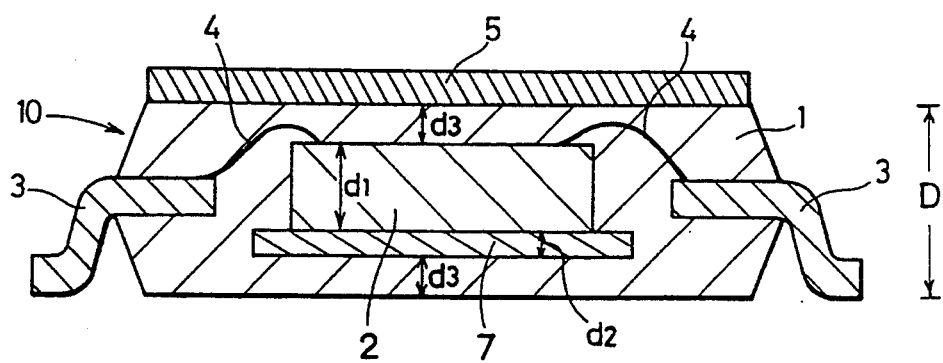
FIG. 1 is a sectional view schematically showing a semiconductor device according to a first embodiment of the present invention.

FIG. 1 shows a semiconductor device 10 according to a first embodiment of the present invention. A semiconductor chip 2, which is provided on a substrate 7, is connected to lead terminals 3 through wires 4, and housed in a molded resin package 1. The resin package 1 is made of epoxy resin which is mixed with carbon black and a filler. Further, a light shielding seal 5 is bonded onto the upper surface of the resin package 1. In this semiconductor device 10, the semiconductor chip 2 has a thickness $d_1$ of about 450 μm, the substrate 7 has a thickness $d_2$ of about 150 μm, and a part, which is deposited on the semiconductor chip 2, of the resin package 1 has a thickness $d_3$ of about 200 μm. The resin package 1 has a thickness D of about 1 mm.

Figure 2:
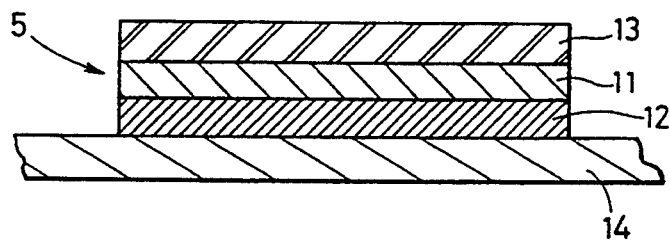
FIG. 2 is a sectional view showing the structure of a light shielding seal which is employed in the first embodiment.

Referring to FIG. 2, the light shielding seal 5 is formed by stacking a metal deposition layer 11 of aluminum or the like, a silicon-based adhesive layer 12 which is colored black, and a protective film 13 of polyester or the like on a mount 14. The metal deposition layer 11 reflects light, while the adhesive layer 12 absorbs light.

Thus, the light shielding seal 5 reflects light by the metal deposition layer and absorbs light by the black coloring agent which is applied onto its rear surface. This seal 5 is adapted to intercept external light with the resin package 1.

Figure 3:
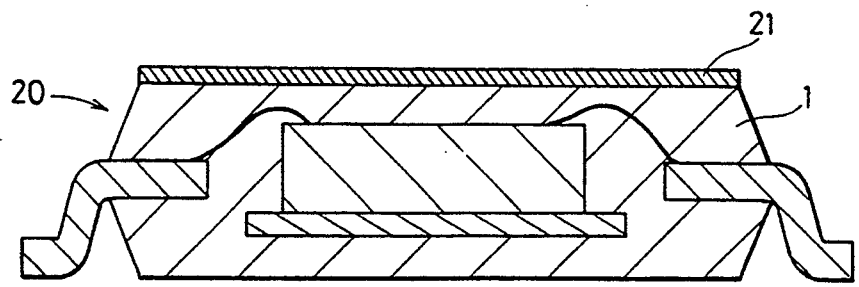
FIG. 3 is a sectional view schematically showing a semiconductor device according to a second embodiment of the present invention.

FIG. 3 shows a second embodiment of the present invention. Referring to FIG. 3, the structure and dimensions of a semiconductor device 20 according to this embodiment are similar to those of the semiconductor device 10 of the first embodiment, except for the light shielding seal 5. A resin package 1 of this semiconductor device 20 is made of epoxy resin, which is mixed with carbon black and a filler, similarly to that of the first embodiment.

An alumina layer 12 is formed on the upper surface of the resin package 1 by CVD. This alumina layer 21 has a thickness of about 100 μm. More preferably, the thickness of the alumina layer 21 is not more than 100 μm, so that the thickness of the semiconductor device 20 is not increased by this layer 21. The alumina layer 21 is adapted to intercept external light. In place of alumina, ceramics such as $SiO_2$, or a metal such as Al, Ag or W may be deposited on the resin package 1. When a metal is deposited, it is necessary to carefully treat the metal film so that the same is not in contact with lead terminals.

Figure 4:
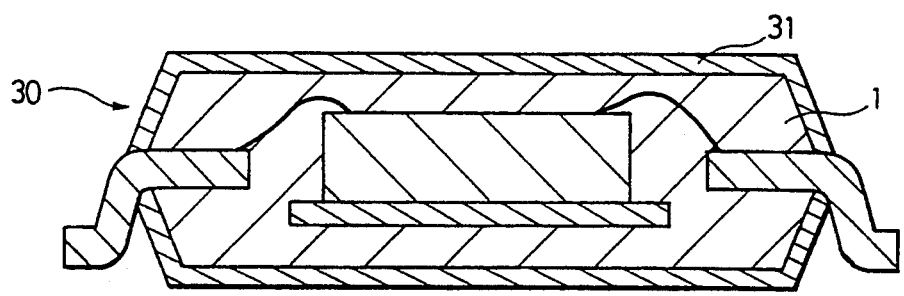
FIG. 4 is a sectional view schematically showing a semiconductor device according to a third embodiment of the present invention.

FIG. 4 shows a third embodiment of the present invention. Referring to FIG. 4, the structure and dimensions of a semiconductor device 30 according to this embodiment are similar to those of the semiconductor device 10 of the first embodiment, except for the light shielding seal 5. A resin package 1 of this semiconductor device 30 is made of a material which is similar to that of the first embodiment. On the other hand, the surface of the resin package 1 is substantially entirely covered with a film 31, which is made of the same material as the resin package 1. This film 31 is promoted to gelate by heating at least on its surface. The film 31 can alternatively be made of a material, such as polyester resin, for example, which is different from that for the resin package 1. In this case, the package 1 is dipped in a polyester solution, hardened and dried, thereby forming the film 31. This film 31 has a refractive index which is different from that of the resin package 1, to effectively prevent penetration of light.

Figure 5:
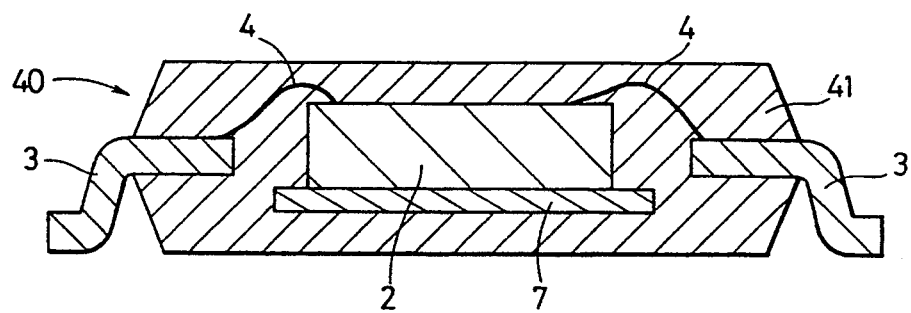
FIG. 5 is a sectional view schematically showing a semiconductor device according to a fourth embodiment of the present invention.

FIG. 5 shows a semiconductor device 40 according to a fourth embodiment of the present invention. Referring to FIG. 5, a semiconductor chip 2, which is provided on a substrate 7, is connected to lead terminals 3 through wires 4, and housed in a molded resin package 41. The overall resin package 41 homogeneously contains carbon black, as well as black iron oxide or aniline black, which absorbs light over a range of ultraviolet to infrared regions. Further, the resin package 1 can contain at least one of an oxide, a sulfide and a salt of a metal, an inorganic pigment such as a ferrocyanic compound, and an organic pigment such as an azo-based or phthalocyanine-based one.

Figure 6:
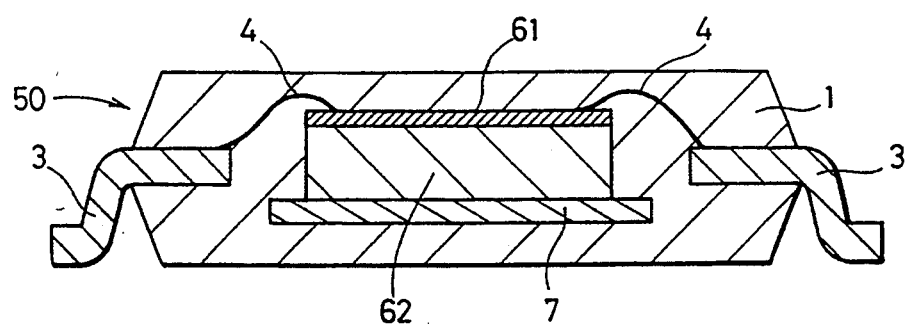
FIG. 6 is a sectional view schematically showing a semiconductor device according to a fifth embodiment of the present invention.
Figure 7:
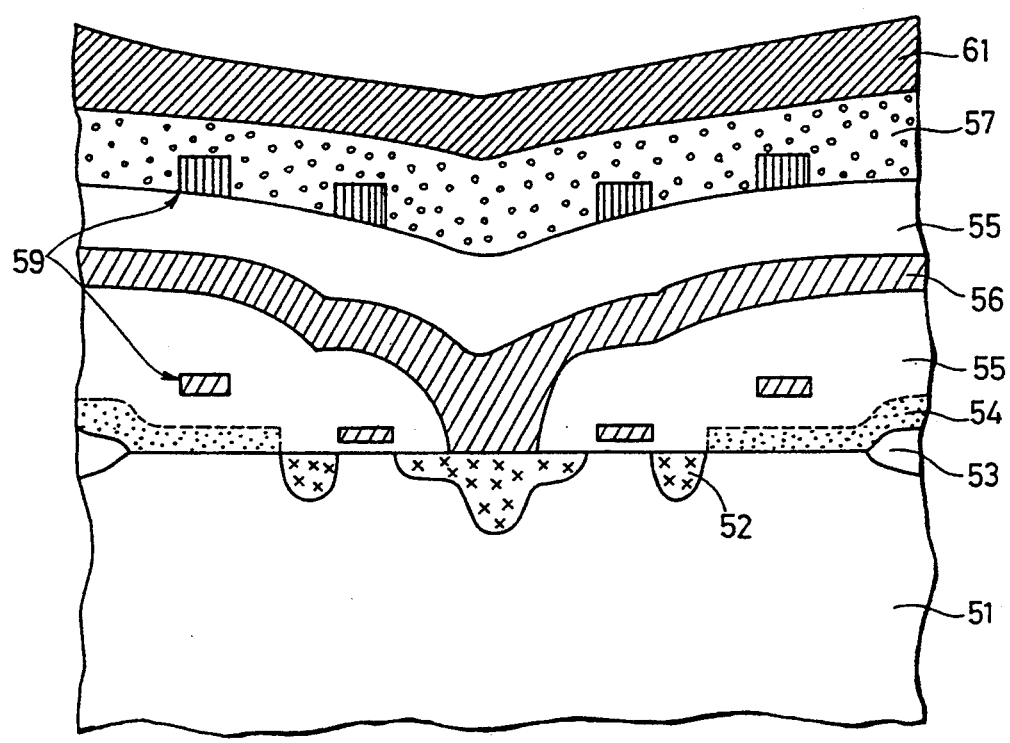
FIG. 7 is a sectional view schematically showing the structure of a semiconductor chip which is provided in the fifth embodiments of the present invention.

FIG. 6 shows a semiconductor device 50 according to a fifth embodiment of the present invention. Referring to FIG. 6, the surface of a semiconductor chip 62, which is provided on a substrate 7, is covered with an absorption layer 61 of polyimide mixed with carbon black. The semiconductor chip 62 has a structure shown in FIG. 7, for example. An $N^+$-type diffusion layer 52 is formed in a p-type silicon substrate 51, while an oxide film 53, a cell plate 54, a smooth coat 55, a bit line 56, a nitride coat 57, and word lines 59 are formed on the substrate 51. The absorption layer 61 is formed on the nitride coat 57. This absorption layer 61 can effectively absorb light whose wavelength is below that of infrared light. Thus, external light is further intercepted by the absorption layer 61.

Figure 8:
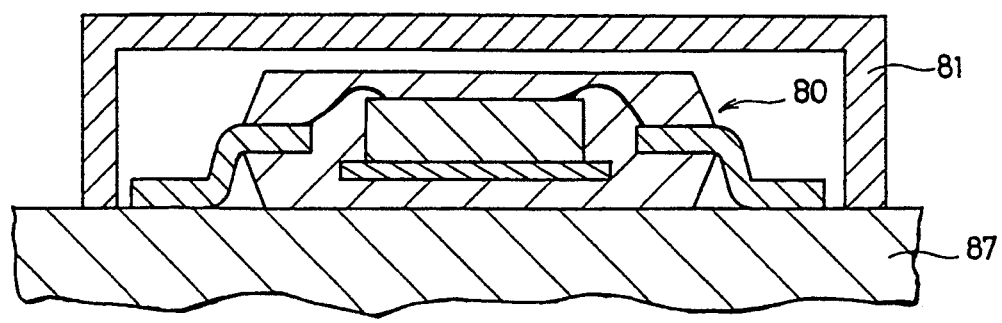
FIG. 8 is a sectional view showing a package for a semiconductor device according to a sixth embodiment of the present invention.

FIG. 8 shows a sixth embodiment of the present invention. Referring to FIG. 8, a semiconductor device 80 which is mounted on a wiring board 87 is covered with a package 81. The package 81, which is made of epoxy resin, is bonded onto the wiring board 87. The structure and dimensions of the semiconductor device 80 are similar to those of the semiconductor device 10 according to the first embodiment, except for the light shielding seal 5.

Figure 9:
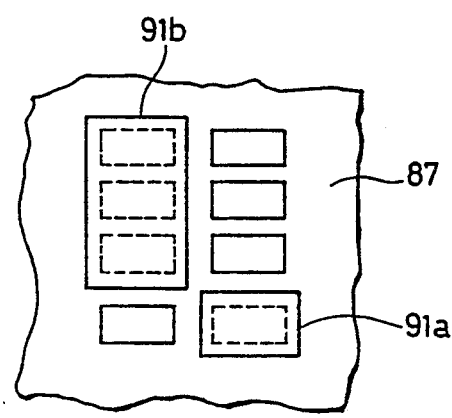
FIG. 9 is a plan view partially showing the package according to the sixth embodiment covering a semiconductor device.

As shown in FIG. 9, a single semiconductor device may be covered with a package 91a, or a plurality of semiconductor devices may be covered with a package 91b. The material for such packages is not restricted to the aforementioned epoxy resin, but may alternatively be prepared from another resin such as silicone resin, ceramics such as alumina, a metal, or the like. When a package is made of resin, it is possible to mix the resin with a material which absorbs and/or reflects light.

In each of the aforementioned embodiments, the resin package may be mixed with silica which is colored with an inorganic or organic pigment, to be improved in light shielding ability.

According to the present invention, as hereinabove described, it is possible to provide a highly reliable semiconductor device, which is improved in light shielding property, without substantially changing the reduced weight and size of the semiconductor device. According to the present invention, further, a semiconductor device which is packaged on a wiring board can be effectively shielded against light, to be improved in reliability. Thus, it is possible to prevent a dynamic RAM from a malfunction which may be caused by light, as well as to prevent a ROM from erroneous memory erasing which may be caused by light.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, comprising:
   a semiconductor chip; and
   a resin mold having a light shielding property in which said semiconductor chip is housed; wherein said semiconductor chip has its surface covered with
      a layer of polyimide mixed with a black material, said layer being discrete from said resin mold; and
   wherein the thickness of said resin mold deposited on the semiconductor is less than 200 microns.

2. The semiconductor device according to claim 1, wherein said black material is carbon.

3. The semiconductor device according to claim 1, wherein thickness of said semiconductor device itself is not higher than 1 mm.

4. The semiconductor device according to claim 1, wherein said resin mold is essentially made of a epoxy resin containing carbon black and a filler.

5. A semiconductor device, comprising:
   a semiconductor chip; and
   a resin mold having a light shielding property in which said semiconductor chip is housed; wherein said semiconductor chip has its surface covered with
      a layer of polyimide mixed with a black material, said layer being discrete from said resin mold, and
   thickness of said semiconductor device itself is less than 1 mm.

6. The semiconductor device according to claim 5, wherein said black material is carbon.

7. The semiconductor device according to claim 5, wherein said resin mold is made essentially of an epoxy resin containing carbon black and a filler.

8. The semiconductor device according to claim 5, wherein thickness of said resin mold deposited on said semiconductor chip is less than 200 μm.

* * * * *